United States Patent [19]

Bird

[11] Patent Number: 5,410,502

[45] Date of Patent: Apr. 25, 1995

[54] OPTO-ELECTRONIC MEMORY SYSTEMS

[75] Inventor: Neil C. Bird, Horley, England

[73] Assignee: U.S. Philips Corporation, New York, N.Y.

[21] Appl. No.: 277,443

[22] Filed: Jul. 19, 1994

[30] Foreign Application Priority Data

Jul. 21, 1993 [GB] United Kingdom ............... 9315126

[51] Int. Cl.6 ............................................. G11C 11/42
[52] U.S. Cl. ................... 365/108; 365/112; 235/454
[58] Field of Search ................ 365/108, 112, 109, 64; 359/36, 54; 235/454, 455, 457, 460

[56] References Cited

U.S. PATENT DOCUMENTS

| | | | |
|---|---|---|---|
| 4,752,820 | 6/1988 | Kurdiwa et al. | 365/108 |
| 4,896,149 | 1/1990 | Buzak et al. | 365/112 |
| 5,262,149 | 11/1993 | Shannon | 365/108 |

FOREIGN PATENT DOCUMENTS

| | | |
|---|---|---|
| 0233104 | 8/1987 | European Pat. Off. . |
| 0509597 | 10/1992 | European Pat. Off. . |
| 2050663 | 1/1981 | United Kingdom . |
| 2161632 | 1/1986 | United Kingdom . |

Primary Examiner—Joseph A. Popek
Assistant Examiner—Tan Nguyen
Attorney, Agent, or Firm—David R. Treacy

[57] ABSTRACT

In an opto-electronic memory system having a memory element (14), for example an optical data card, in which optically-encoded data is stored in rows of memory locations (17) and reading elements (10,12) comprising a photosensitive element array (12) and operable to read out stored data in response to illumination of the memory locations, data is stored at memory locations as colors representing different data values and the memory locations are addressed with reading light of different colors in sequence, thereby enabling higher data storage capacities to be obtained. The memory locations may be reflective or transmissive. The reading elements may comprise linear or two dimensional arrays of photosensitive elements.

15 Claims, 4 Drawing Sheets

OPTO-ELECTRONIC MEMORY SYSTEMS

BACKGROUND OF THE INVENTION

This invention relates to an opto-electronic memory system comprising a memory element in which data is stored in rows of optically readable memory locations, electro-optical reading means for reading the rows of memory locations and comprising an array of light photosensitive elements.

Examples of such systems are described in GB-A-2050663, GB-A-2161632 and EP-A-0509597. In these examples, information comprising data is stored in the memory elements in the form of optically differentiatable data bits of differing optical reflectivity or transmissivity. In GB-A-2050663 a perforated card type of data storage element is used whose information is read by feeding the card between aligned linear sets of LEDs and phototransistors. As the card is moved between the arrays, rows of data are read out with the passage of light from an individual LED to its associated phototransistor being determined by the presence or absence of an aperture in the card. In GB-A-2161632 data is stored in an optical memory card as regions of different reflectivity by means of pits, spots or marks. To read this data, a laser beam is scanned over the card using an electro-mechanical drive with retro-reflected laser light being detected by a linear CCD array. In EP-A-0509597, data is stored in memory locations of an optical memory card as regions having different optical transmissivity formed, for example, as transparent and opaque regions in a photographic film. Data read-out is achieved using an electro-optic (liquid crystal) shutter arrangement and a two dimensional array of photosensitive elements disposed on opposite sides of the card. The shutter arrangement illuminates a row of memory locations at a time and the contents of the row are read by the photosensitive elements which are each linear and extend parallel to one another perpendicularly of the row direction.

In these systems optically encoded data can be stored in the memory elements as bits in binary form with each bit location having two optically different states, either transmissive or opaque, or reflective or non-reflective, to represent digital logic values "1" and "0" respectively, or vice versa. Thus each location defines one bit of data.

The data density of the memory element in these systems is limited by the physical size of the photosensitive elements, at least in one dimension, of the light sensing component used to read the memory element for both linear and two-dimensional arrays of photosensitive elements. The resolution of the light sensing component in the reading means is determined by the pitch of the photosensitive elements, and to an extent also by the cone of acceptance of light of those elements. By reducing the pitch, and the cone of acceptance, a greater resolution can be obtained which, in turn, allows the density of the memory locations, and thus amount of data stored, in a memory element of a given size to be increased. However, arrays of photosensitive elements having a smaller pitch are more difficult to fabricate and lower yields can be expected. Consequently, manufacturing costs are increased. Moreover, there are limitations as to how far the photosensitive elements can be reduced in size bearing in mind restrictions to the technology used to fabricate the elements and the ability of the elements to have the required operational characteristics, with the appropriate discrimination, when reading data.

It is mentioned in EP-A-0509597 that it may be possible to record information in the memory element as a multi-level, quasi-analogue, optical transmission factor in the manner of a grey scale with individual memory locations providing one of a series of light attenuation levels. In this way, more than one bit could in effect be stored at each memory location. However, as is pointed out in that specification, the light sensitive elements would then need to be appropriately responsive to different levels of illumination to produce respectively different output signals clearly in order to distinguish the information. In practice, such operation would be difficult to achieve reliably. For smaller photosensitive elements it becomes increasingly difficult to resolve the grey-levels.

SUMMARY OF THE INVENTION

It is an object of the present invention to provide an opto-electronic memory system in which the memory element is capable of storing greater amounts of data.

It is another object of the present invention to provide an opto-electronic memory system in which data can be stored in the memory element, and read-out from the memory element, in a reliable and convenient manner.

According to the present invention, an opto-electronic memory system of the kind described in the opening paragraph is characterised in that data is stored at the memory locations of the memory element as a colour with different data being represented by respective different colours and in that the reading means includes means for addressing the memory locations sequentially with reading light of different colours.

By using colour to represent data, greater storage capacities for the memory element can be obtained and the optically encoded data stored in the memory element can be increased without a corresponding increase in the performance of photosensitive elements being required. Importantly, the increased storage capacity of the memory element does not demand that a smaller size of photosensitive element be used. Thus, the one to one memory location/photosensitive element ratio limitation is overcome and the amount of data stored in the memory element can be significantly increased and read easily by the array of photosensitive elements without any change in the size of pitch of the photosensitive elements.

The memory locations of the memory element may either be of a transmissive kind, in which case the photosensitive elements are responsive to reading light transmitted through the memory locations and the memory element is disposed between the source of illumination and the array of photosensitive elements when performing a reading operation, or of a reflective kind, in which case the photosensitive elements are responsive to reading light reflected by the memory locations and the source of illumination and the photosensitive element array are both disposed on the same side of the memory element. In the former case, the memory element preferably further includes memory locations which respectively are substantially transmissive and substantially non-transmissive to all colours of reading light. In the latter case, the memory element preferably includes memory locations which respectively are substantially reflective and substantially non-reflective to all colours of reading light.

Each different colour used for the colour-encoded memory locations preferably represents respective multi-bit data value. In a preferred embodiment, six different colours are available for encoding, comprising the three primary colours (red, green and blue), the three complementary (secondary) colours, (yellow, cyan and magenta), as well as white (reflective) and black (non-reflective) or opaque and transparent for a reflective or a transmissive reading mode of operation respectively. Then, by addressing the memory element in turn with light of the three primary colours it is possible to obtain a unique combination of outputs from a photosensitive element associated with a memory location for each of the eight possible optical states of that memory location to which eight different three-bit values can be assigned. Each single memory location is thus capable of providing three bits of data, resulting in a three-fold increase in the effective data density of a memory element for a given memory location pitch.

The reading means may comprise a one dimensional (linear) array of photosensitive elements, similar in respects to those used in some document scanners, for reading a row of memory locations at a time, or a two-dimensional array of photosensitive elements of the kind described in EP-A-0509597 and comprising a set of linear photosensitive elements arranged in parallel with one another. Alternatively, the photosensitive element array may comprise a two dimensional matrix array of individual elements each of which is arranged to read a respective memory location, and may for example be similar to those used for image sensing purposes in, for example, document readers for facsimile and copying equipment.

The means for addressing the memory locations with reading light of different colours may take various forms. For example, a white light source may be used in combination with a colour filter arrangement which is selectively operable to provide separate colour light outputs. Alternatively, separate light sources, emitting respectively-coloured light and operable individually in sequence to emit light may be employed. As another, and preferred, example, an electro-optic shutter arrangement comprising an array of, for example, liquid crystal, light shutter elements which include colour filter elements may be used together with a white light source, the required differently-coloured outputs being provided by selectively energising the appropriately colour shutter element(s). Such an arrangement offers compactness and the possibility of additional functionality such as information display.

In the case of a one dimensional array of photosensitive elements being used, the addressing means need only provide a band of light to illuminate a row of memory locations. A similar band of light is used where reading means like that described in EP-A-0509597, although in this case the electroptic shutter arrangement is illuminated with a flood light source. For a two dimensional matrix array of individual photosensitive elements, the addressing means is preferably arranged to flood the memory element with light, one colour at a time, so as to illuminate all memory locations simultaneously.

In another embodiment of the invention, the reading means may comprise a plurality of mutually spaced linear arrays of photosensitive elements, each of which is arranged to operate with reading light of a respective one of the different colours, with each of the arrays being arranged to read a group, such as a line, of memory locations in turn. For example, the memory element may be displaced in stepped fashion relative to the arrays so that an individual line of memory locations is read by three arrays in turn, using respectively red, green and blue coloured light, while at any one time when the line is being read by one array, the other two arrays are reading different lines. In this example, therefore, each individual photosensitive element is required to operate with light of only one colour, unlike the aforementioned cases in which each photosensitive element operates with reading light of each of the different colours. Because each array is associated with light of the respective colour, the illuminating means is simplified.

The outputs obtained from the photosensitive elements for individual memory locations in response to the memory locations being addressed with light of different colours, regardless of whether the photosensitive elements are in a single linear array, a plurality of linear arrays or a two dimensional array as described above, are determined by the colour of the individual memory location. When appropriately addressed with, for example, three different colours, three outputs can be obtained which are dependent on, and uniquely identify, the colour of the memory location and are indicative of the data stored in the memory location as represented by that colour. Assuming, for example, that a photosensitive element produces high output signal upon being illuminated and a low output signal when not illuminated, then a sequence of high, and/or low signal outputs is obtained which differs for different colour memory locations. The output can then be used in a direct correspondence manner for the stored data, that is, giving a three bit data value of, for example, logic values "1", "0", "0" for a red memory location, using a threshold detector circuit or similar. The way in which the data value outputs are obtained is dependent on the type of photosensitive array employed. For photosensitive elements being in a linear or a two-dimensional array and comprising photodiode structures having a respective output terminal, their output terminals could be connected to a respective stage of a register circuit which provides a serial output of the multi-bit data values or alternatively a parallel output comprising bytes of information. In the case of the reading means comprising a plurality of linear arrays each associated with a respective colour, a more complicated output circuit would be required bearing in mind that the output signals from respective photosensitive elements in each array need to be coordinated in order to provide an output indicative of the multi-bit data value of an individual memory location. For an array comprising a two-dimensional matrix array consisting of rows and columns of individual photosensitive elements then an array similar to those used for image sensing in document readers may be used in which the photosensitive elements each typically comprise a series combination of a photodiode and a capacitor or a photodiode and a switching diode or a photodiode and TFT, and are connected at the intersections between sets of row and column address conductors. The array can then be operated in a known manner with the photosensitive elements being read a row at a time and their outputs supplied via the column conductors to a respective stage of a decoder circuit.

BRIEF DESCRIPTION OF THE DRAWINGS

Opto-electronic memory systems in accordance with the present invention will now be described, by way of example, with reference to the accompanying drawings, in which.

Figure 1:
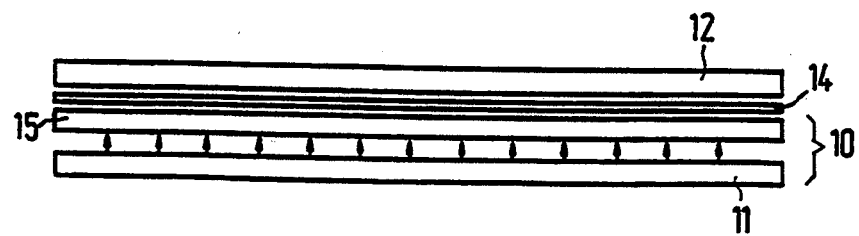
FIGS. 1 and 2 are respectively a schematic side view illustrating the disposition of the main components of an embodiment of the memory system in use and a diagrammatic plan view of the memory system.

It will, of course, be appreciated that the Figures are merely schematic and are not drawn to scale. In particular certain dimensions, such as the thicknesses of layers, may have been exaggerated whilst other dimensions may have been reduced. The same reference numerals are used throughout the drawings to indicate the same, or similar, parts.

DESCRIPTION OF THE PREFERRED EMBODIMENTS

In all embodiments the electro-optic memory system comprises a planar memory element in which optically readable information signifying data is stored in a two dimensional planar array of memory locations as optically-encoded data, and a reader unit for reading the information from the memory element.

Referring to the embodiment of FIG. 1, the reader unit comprises two juxtaposed main parts, namely an electro-optic scanning component 10, to which addressing signals are applied, and a light sensing component 12 from which electrical output signals are obtained indicative of information stored in the memory element, referenced at 14. The system, its operation, and its intended uses, are generally similar to those of the system described in EP-A-0509597 to which reference is invited for further information and whose disclosure is incorporated herein by reference. Briefly, and referring also to FIG. 2, from which the memory element 14 has been omitted for clarity, the scanning component 10 comprises illumination means 11 and a liquid crystal panel 15 providing a two dimensional planar array of electro-optic, liquid crystal, shutters 16, defined by respective regions of the panel, of elongate strip shape and arranged closely spaced and parallel to one another in one direction, in this example a column direction. Each shutter is selectively operable by the application of suitable voltages to switch from a light blocking state to a light transmissive state to allow light from the illumination means 11 to pass therethrough. The regions between adjacent shutters are masked with light absorbing material so that the light shutter regions are clearly defined and separated. The illumination means 11 comprises a flood light source which illuminates uniformly the input side of the panel 15 with substantially parallel light directed perpendicularly to the plane of the panel.

The scanning component 10 is operated by appropriately switching each of the shutters 16 in sequence to scan the facing surface of the memory element in a direction perpendicular to the direction of the shutter, i.e. in the row direction, in step fashion with an elongate band of light whose length and width correspond approximately with the equivalent dimensions of the shutters 16, and which covers a complete line of memory locations of the memory element 14.

The light sensing component 12, disposed on the side of the memory element 14 remote from the light shutter panel 15, comprises a planar array of photo-electric light sensitive elements 18 of elongate strip shape and arranged closely spaced parallel to one another. The light sensitive elements 18 extend at right angles to the shutters 16, i.e. in a row direction. The sets of shutters 16 and light sensitive elements 18 thus cross-over one another and define at their intersections respective read-out regions, for example as indicated at 20, whose size is determined by the dimensions of the overlapping portions of the respective shutters 16 and elements 18. The components 10 and 12 are assembled and held together using any suitable supporting structure (not shown) to define a gap therebetween into which the memory element 14 is placed for reading.

The memory element 14 comprises an information storage medium having a regular row and column array of transmissive memory locations whose pitch corresponds to that of the read-out regions 20. Data is stored at the memory locations of the memory element 14 as a colour characteristic with different colour characteristics serving to represent different stored data values. Each memory location comprises an optical filter of one of eight possible colour characteristic values, consisting of the three primary colours red, green and blue, the three complementary colours, yellow, cyan and magenta, and, also "black" and "white" filters, the latter two being provided respectively by filters that are substantially opaque and substantially transparent to red, green and blue light wavelengths. The memory element can comprise a transparent plastics film which is selectively dyed with the appropriate colours, including black, at the memory location regions to provide respective colour filters, except for those locations which are to be "white" for which no dye is provided so the region remains clear. The memory element may be produced using technology similar to that employed for producing the colour micro-filter arrays used in colour liquid crystal display devices. Colour photographic film could also be used as the data storage medium.

To perform a reading operation, the memory element is inserted between the components 10 and 12 with its plane being substantially parallel with those of the shutters 16 and light sensitive elements 18 and its memory locations appropriately in registration with the read-out regions. The opposing surfaces of the memory element 14 are in close proximity with the output and input surfaces of the components 10 and 12 respectively, the gap provided between these components being slightly greater than the thickness of the element 14 so as to allow insertion and removal of the element.

The illumination means 11 is capable of producing separately red, green and blue colour light outputs and may be of any suitable form. For example, it may comprise a white light source whose output is filtered so as to provide red, green and blue light outputs in sequence. To this end, a matrix liquid crystal display panel comprising an array of pixels in combination with a red, green and blue micro-filter array may be used with the pixels associated with each colour being energised in sequence to produce red, green and blue light outputs. Alternatively, the illumination means may comprise separate red, green and blue light sources which are energised in sequence.

Figure 3:
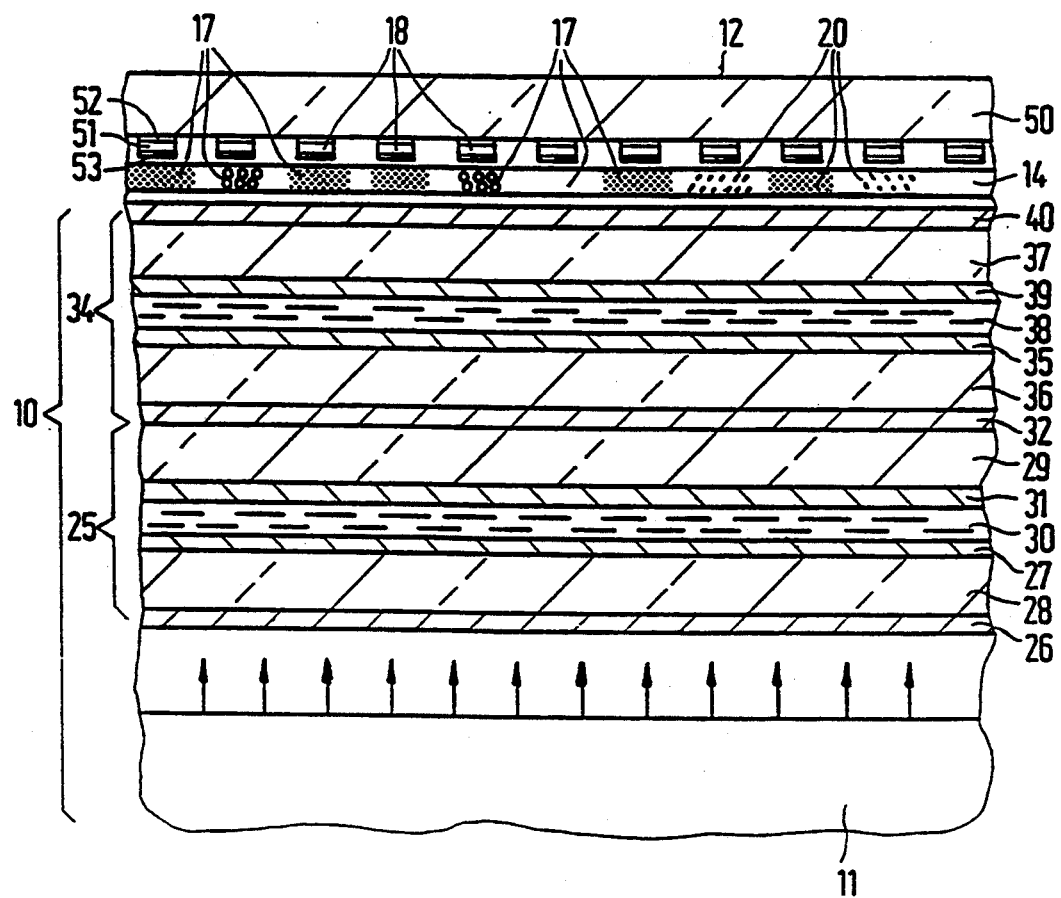
FIG. 3 is an enlarged schematic cross-sectional view through a part of the memory system of FIGS. 1 and 2.

FIG. 3 shows schematically a cross-section schematic view, not to scale, through a part of the structure of the reader unit and with the memory element in situ. Different shading is used in this figure to denote different colours of the memory locations, referenced at 17. The scanning liquid crystal panel 15 in this example is similar to that described in EP-A-0509597 and consists of two liquid crystal cells arranged overlying one another and optically in series to provide a high on/off contrast ratio. Each of the cells, referenced at 25 and 34 respectively, comprises a pair of spaced glass plates 28, 29 and 36, 37 with twisted nematic liquid crystal material 30, 38 sealed therebetween. The plates 28, 29 and 37 each carry on their outer surface a polariser, 26, 32 and 40 respectively. The plates 28 and 37 carry on their inner surface a continuous INTO electrode layer 27 and 39 respectively, common to all shutters. The plates 29 and 30 each carry on their inner surface facing the liquid crystal material aligned sets of spaced, strip shape, ITO electrodes 31 and 35 (only one of each of which is visible) with each pair of aligned electrodes 31 and 35 defining co-extensive regions of the two liquid crystal cells which together constitute a respective liquid crystal shutter. Regions of the glass supports 29 and 36 intermediate the strip electrodes 31 and 35 are covered with a black, light absorbing, matrix, (not visible in FIG. 3).

The set of photosensitive elements 18 are carried on a surface of a planar glass supporting substrate 50 facing the scanning component 10. Each element 18 comprises an elongate layer of amorphous silicon semiconductor material 51 having an n-i-p structure sandwiched between a metal strip electrode 52 on the substrate 50 and a transparent electrode 53 of ITO remote from the substrate 50. The structure on the substrate 50 is fabricated using conventional thin film technology by depositing and patterning photolithographically thin film layers.

Figure 2:
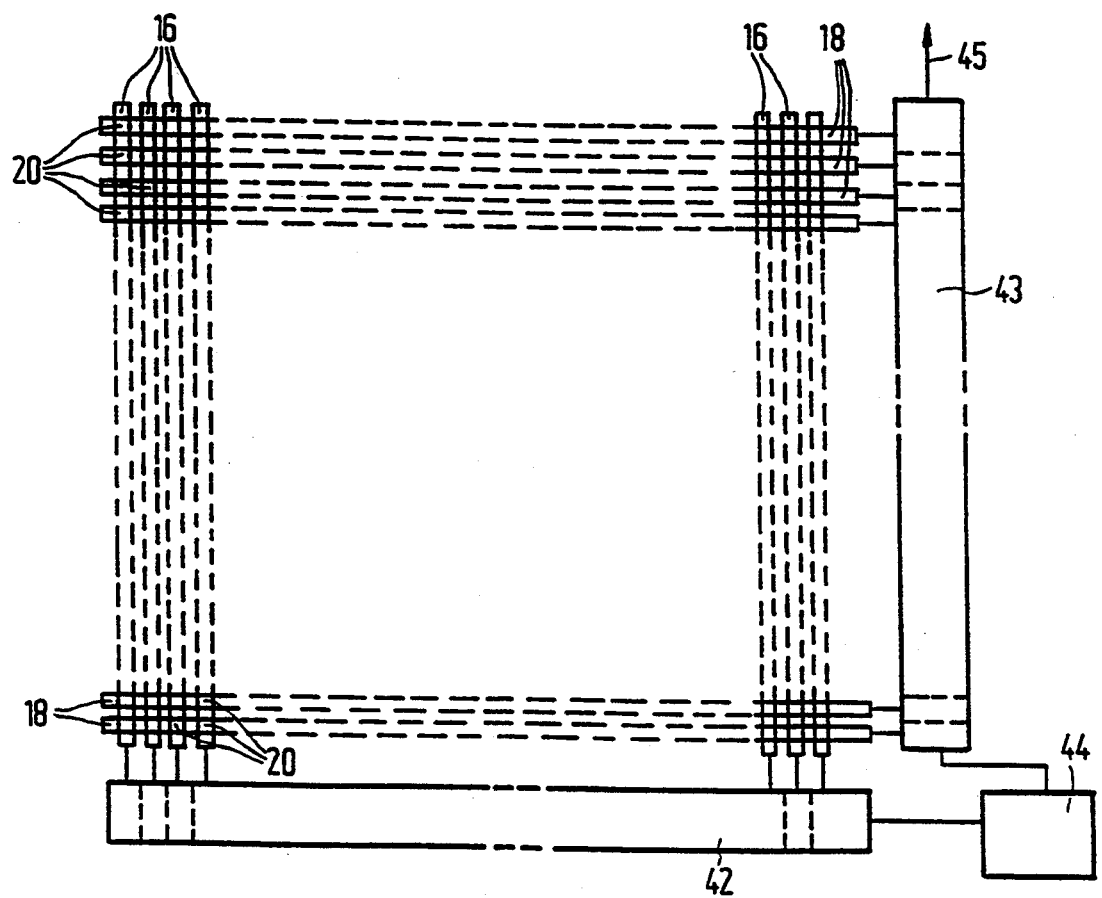

Each aligned pair of strip electrodes 31 and 35 constituting a respective shutter 16 is connected to a respective output stage of a scan drive circuit 42 (FIG. 2). An electrode terminal of each of the light sensitive elements 18 is connected to a respective stage of an output register circuit 43 which includes charge sensitive amplifiers. The electrodes 27 and 39 of the shutters and the other terminals of the elements 18 are connected to a drive circuit providing appropriate predetermined potentials. The circuits 42 and 43 are connected to a timing and control circuit 44 through which their operations are controlled and synchronised.

The shutters 16 are normally held in their off state to block light and the circuit 42 operates to switch in turn each shutter to its transmissive state thereby to scan in step fashion the memory element 14 with reading light in the row direction and address the memory locations 17 a column at a time.

When reading the memory locations, the illumination means is switched between the three colour light outputs in turn while one shutter 16 is energised so that the region of the memory element overlying that shutter 16 is addressed with red, green and blue colour reading light in sequence. The response of the photosensitive elements 18 during each of these different colour exposures depends on whether or not the reading light is transmitted through their immediately underlying memory locations, and thus on the colour characteristic of those memory locations. Each of the eight possible colour characteristic states of the memory locations produces a unique set of outputs from a photosensitive element when addressed with the three colours of light in sequence. A "black" memory location is signified by the lack of any output from each colour address. The sequence of outputs, e.g., high or low signal outputs, from an individual photosensitive element 18 is decided by the colour characteristic of its associated memory location. The following table illustrates the outputs obtained from each of the eight possible memory location colour characteristics, H and L denoting respectively a high and a low output signal from the photosensitive element:

TABLE 1

| Memory | Photosensitive Element Output | | | |
|---|---|---|---|---|
| Location | Red Light | Green Light | Blue Light | Data |
| Black | L | L | L | 000 |
| White | H | H | H | 111 |
| Red | H | L | L | 100 |
| Green | L | H | L | 010 |
| Blue | L | L | H | 001 |
| Yellow | H | H | L | 110 |
| Cyan | L | H | H | 011 |
| Magenta | H | L | H | 101 |

The read-out from each type of memory location thus consists of a unique combination of signals from the photosensitive element. These can be used directly to represent a three bit data value, "1" for high and "0" for low, as indicated in the end column of the above Table.

The signals obtained from each memory location in the addressed column are supplied to the respective stage of the output register circuit 43 which includes a threshold circuit so as to positively discriminate between the high and low signals and provide unambiguous "1" and "0" values. The contents of the output register 43, comprising the data values for a column of memory locations, are then fed out from an output 45 in serial fashion. As each shutter 16 is energised in sequence, the information stored in each column of memory locations is accessed and read-out provided separately a column at a time in succession. The data values obtained on read-out may be translated to provide alternative electronic representations of stored information rather than simply three-bit data values. Data assigned to the different colours can thus be selected according to the intended use. The output 48 may be connected to a conversion circuit which converts the data values, for example using a look-up ROM, into different codes or otherwise assigns a different and respective form of output for each of the data values.

Figure 4:
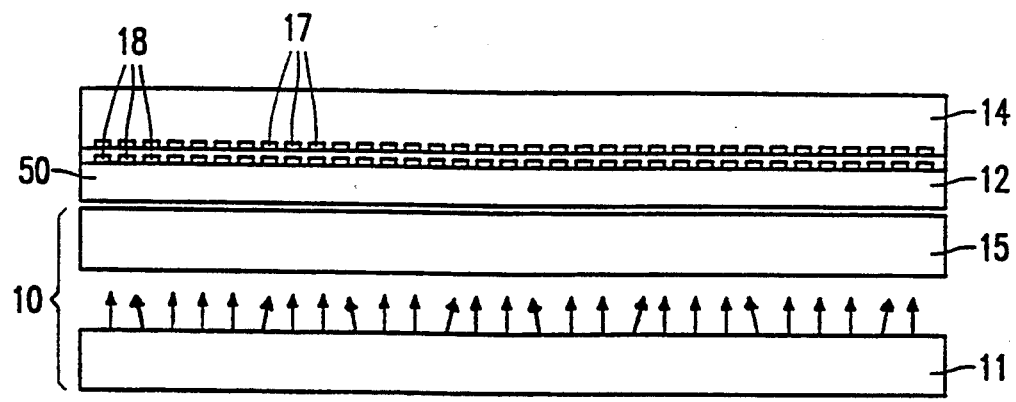
FIG. 4 is a schematic side view similar to FIG. 1 illustrating a modified form of the system of FIG. 1.

In a modification of the above-described embodiment, as illustrated schematically in FIG. 4, the photosensitive element array is disposed directly over the electro-optic scanning component 10 with the photosensitive elements 18 facing away from the component 10 and the memory element 14 is placed directly over the array in close proximity to the photosensitive elements so that the memory locations are read by a proximity focussing technique, without required focussing lenses, similar to that used in contact image sensors. The photosensitive elements are covered by a thin, transparent, protective film that defines a reading surface on which the memory element 14 is supported. The light output from the electro-optic scanning component 10 passes through the spaces between adjacent elements 18 of the light sensing component 12 and is reflected by the memory locations, depending on the colour of the illuminating light and the colour characteristics of the memory locations, back towards the photosensitive elements. In order to shield the photosensitive elements 18 from light coming directly from the electro-optic scanning component 10 the lower contact electrodes of the photodiodes are formed of opaque metal having a width greater than that of the overlying semiconductor material. The illuminating means 11 is in this embodiment arranged to produce diffuse, diverging light rather than parallel light. Because they are read in a diffuse reflection mode, the memory locations of the memory element consist of regions having a suitable reflective rather than transmissive colour characteristic. They can be provided in a variety of forms using any suitable medium in which the colour reflectance characteristic of localised surface areas can be selectively determined either permanently or reversibly, as a means to store information in a manner compatible with colour reading and the contact sensing approach. For example, the memory element may comprise a substrate of card or plastics on whose surface the memory locations are printed using colour inks or dyes. The "black" and "white" memory locations in this case are provided simply as black and white coloured regions which respectively absorb and reflect red, green and blue colour light. Alternatively, a photographic medium may again be used.

Figure 5:
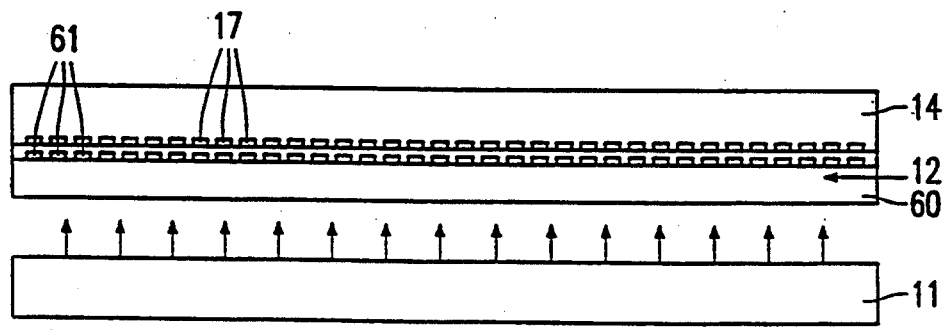
FIGS. 5 and 6 are schematic side views illustrating alternative forms of a second embodiment of opto-electronic memory system according to the invention.
Figure 6:
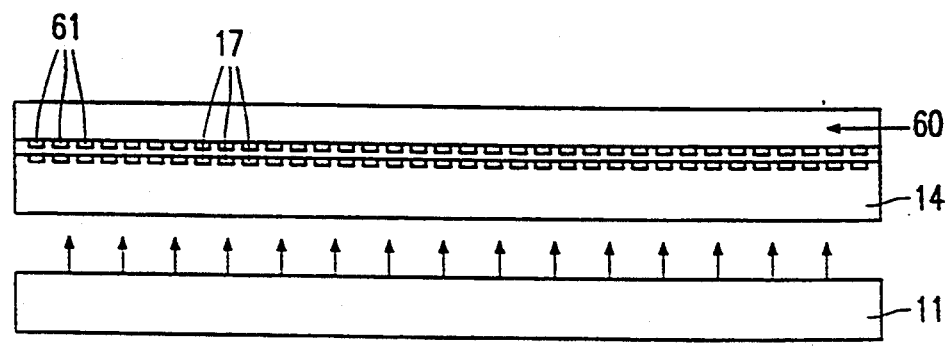

In another embodiment of the invention, the reader unit comprises a two-dimensional regular matrix array of individual photosensitive elements arranged in rows and columns together with illuminating means which operates as a flood source to illuminate the memory element substantially uniformly over its area with red, green and blue colour light in sequence. The pitch of the photosensitive elements, in both the row and column directions corresponds with the pitch of the memory locations in the memory element so that, when arranged in proximal relationship for a read-out operation, each photosensitive element reads a respective memory location of the memory element. In this embodiment, the scanning function of the reader unit is performed in the photosensitive element array itself by operating rows or columns of the elements in sequence rather than using an electro-optic shutter arrangement. Read out of the memory element may be effected in either a reflective or transmissive mode. FIGS. 5 and 6 are schematic side views, not to scale, illustrating the relative disposition of the components of this system for reflective and transmissive read-out modes respectively. Referring to FIG. 5, the photosensitive element array, 60, is disposed between the illuminating means 11 and the memory element 14 with the individual photosensitive elements, 61, of the array being aligned with respective memory locations 17, so as to sense light reflected back from the memory locations in similar manner to the arrangement of FIG. 4, again with the photosensitive elements being shielded from light coming directly from the illuminating means. In the transmissive mode arrangement of FIG. 6, the memory element 14 is disposed between the illuminating means 11 and the photosensitive element array, 60, with the individual elements 61 being aligned with respective memory locations 17 so as to sense light transmitted through the memory locations in similar manner to the arrangement of FIG. 3.

Figure 7:
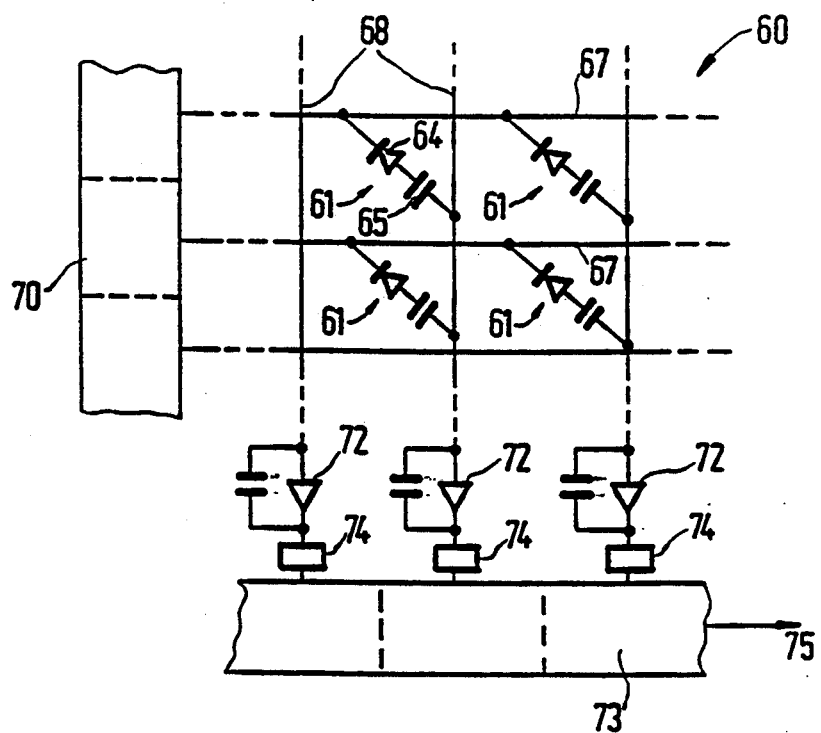
FIG. 7 shows the circuit of a typical part of a light sensing component of the embodiment of FIGS. 5 and 6.

In both versions, the photosensitive elements 61 of the array 60 are covered by a protective, transparent, film defining a surface against which the memory element is disposed in close proximity to the elements. The array 60 can be of the thin film active array kind used in image sensing. The circuit configuration of a part of a typical example of such an array is depicted in FIG. 7. In this example, each photosensitive element 61 comprises a thin film amorphous silicon p-i-n photodiode element 64 connected in series with a capacitor 65 between a row address conductor 67 and a column address conductor 68. Each photosensitive element 61 is located at a respective intersection between sets of row and column address conductors. The cathodes of the photodiodes 64 of each row of elements 61 are connected to a respective, common, row address conductor 67 while the capacitors of each column of elements are connected to a respective, column, column address conductor 68. The photodiodes, capacitors and sets of address conductors are carried on a transparent substrate, for example of glass, and fabricated using conventional thin film technology.

The row address conductors 67 are connected to respective stages of a shift register type row drive circuit 70 which applies a predetermined selection voltage to each row address conductor one at a time in turn and a reference voltage in the intervals between the selection voltage. The column address conductors are each connected to a respective charge sensitive amplifier 72 which in turn are connected, via a threshold detector 74, to a stage of an output digital shift register circuit 73 from which a read-out signal in serial form is obtained at 75. The charge sensitive amplifiers 72 serve to convert a current flowing in their associated column address conductors into a voltage output.

The photodiodes 64 act a switches. When sensing incident illumination, the photodiode is reverse-biassed and charge generated by the photodiode 64 is stored in the photosensitive element capacitance 65. When a voltage of the appropriate polarity is applied to the associated row conductor the photo diode becomes forward-biassed and recharges the capacitor 65 to its original value. When the row conductor voltage rises, the photo diode 64 is again reverse-biassed and photogenerated charge is stored in the photosensitive element. The rows of photosensitive elements are accessed sequentially via the row conductors. In operation, the photodiode 64 of an element is forward biassed by the application of the selection voltage to the row address conductor 67 to charge to capacitor 65. Thereafter the row conductor voltage changes to the reference voltage so that the photodiode 64 is reverse-biassed at the start of a light-detection, or integration, period. If during the integration period light is incident on the photodiode 64, electrons and holes will be photogenerated causing a photocurrent which discharges the photodiode self-capacitance and charges the capacitor 65. At the end of the integration period, the row address conductor voltage is changed to the selection voltage thus forward-biassing the photodiode. The forward current from the photodiode 21 then recharges the capacitor 65. Current flowing in the column conductor 68 is sensed by the charge sensitive amplifier 72 which provides an output signal indicative of whether or not the photodiode has been illuminated during the integration period. The above process is repeated for each row of photosensitive elements in turn.

Because the photosensitive element array and its manner of operation are similar to those known for image sensing purposes, the above description has deliberately been kept brief. For further information, reference is invited to EP-A-233104. Further, other kinds of photosensitive element configurations as also known in the field of image sensors, for example, diode/photodiode or photodiode/TFT combinations, may be used.

The memory elements used in this embodiment are of the same form as those described previously for the reflective and transmissive mode versions.

When reading a memory element the memory locations are illuminated three times with red, green and blue light respectively in succession with a read-out obtained from each photosensitive element for each colour. The sequential addressing of the memory locations with different colour light may be performed for each row of memory locations in turn by illuminating the memory element with red, green and blue light and obtaining a read-out from the photosensitive elements in one row once for each colour, then again illuminating the memory element with red, green and blue light and obtaining a read-out from the photosensitive elements in the next row for each colour, and so on. In this case the read-outs for a particular photosensitive element in a row are temporarily stored in the circuit 73 and the three bit data values from each photosensitive element in a row are then fed out from the circuit 73 in serial fashion.

Alternatively, the memory element may be illuminated with light of one colour and read-outs provided from all the photosensitive elements in the array, and this operation then repeated for each of the other two colours. In this case the outputs from the circuit 73 is supplied to a switch circuit operated in synchronism with the switching of the illuminating means and the driving of the photosensitive element array which feeds the output signals to one of three stores for storing respectively red, green and blue read-out data. The contents of these stores are then extracted by a memory read control circuit which appropriately re-combines the data outputs to obtain the three bit data values for each individual photosensitive element/memory location.

Figure 8:
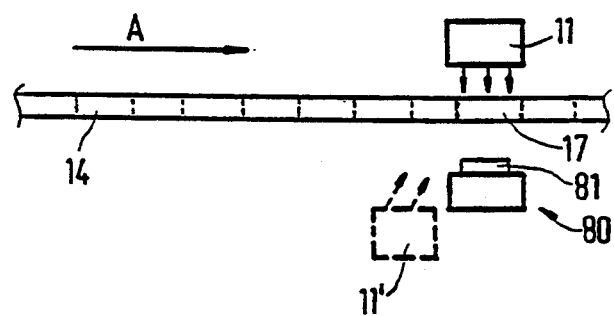
FIGS. 8 and 9 are schematic side views of further embodiments of opto-electronic memory system according to the invention.

In another embodiment of the invention, the light sensing component of the reader unit may comprise simply a linear array of photosensitive elements. FIG. 8 is a schematic side view of such a system illustrating the relative disposition of its components. The photosensitive element array, 80, comprises a row of individual photosensitive elements 81 (only one of which is visible in this side view) having a pitch corresponding to that of the memory locations 17 in a row of the memory element 14 and is arranged on one side of the memory element 14, comprising a transmissive type memory element as previously described, with the array extending parallel to the row direction of the memory locations. The illuminating means 11, which in this case is much smaller as it need only illuminate one row of memory locations at a time, is arranged on the opposite side of the memory element in alignment with the array. Alternatively, the memory element could be of the reflective type as previously described in which case the illuminating means is disposed on the same side of the memory element, and slightly to one side of the array as depicted in broken outline at 11' in FIG. 8.

In order to read the information stored in the memory element, the memory element is displaced relative to the photosensitive element array 80 in step fashion as indicated by the arrow A in FIG. 8 so as to bring each row of memory locations in turn in line with the array. When reading out each row of memory locations, the illuminating means operates to address the memory locations of the row with red, green and blue light in sequence and a read-out is obtained from each element in the array for each colour so that each element produces a three-bit data value according to the colour of the overlying memory location. Although the reader unit in this embodiment is much simpler than those of the previously described embodiments, it is necessary to provide some kind of electro-mechanical drive in order to effect the relative displacement necessary between the reader unit and the memory element.

Figure 9:
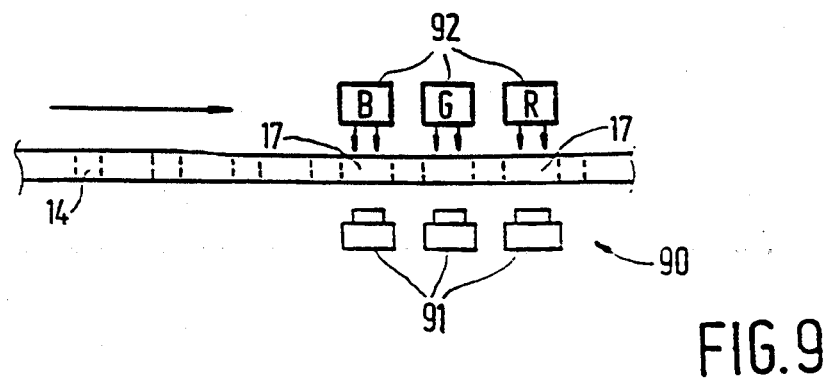

In another embodiment, similar in respects to the above embodiment and shown schematically in side view in FIG. 9, the light sensing component, 90, consists of three linear arrays 91 of photosensitive elements, each comprising a line of individual elements, arranged parallel to and mutually-spaced with respect to one another. The illumination means consists of three light sources 92 emitting red, green and blue light respectively, each of which is associated with a respective one of the linear arrays 91 such that each array reads a row of memory locations of the memory element 14 in response to illumination with light of a respective colour. In this example, the memory element is of the transmissive type. As one array is reading the memory locations in one row, with for example red light, the other two arrays read the memory locations of respective different rows with blue and green light respectively. The memory element 14 is displaced by an electro-mechanical drive in step fashion relative to the arrays 91 as indicated by the arrow so that each row of memory locations is read by each of the arrays 91 in turn. The outputs obtained from the photosensistive elements in each of the arrays for each individual memory location are supplied to a processor where the output from a respective element in each array for an individual memory location are combined together to produce the three bit data value appropriate to that memory location.

Again, a memory element of the reflective kind can be used with the illuminating means and the photosensitive element arrays being arranged on the same side of the element in similar manner to the previous examples.

In all the above-described embodiments, a significant increase in the data density and hence capacity of the memory element is obtained compared with that possible with the memory element of EP-A-0509597 for example. In fact a three-fold increase in data density is achieved. The memory element 14 may be of a size comparable to that of a typical credit card, namely 85 mm by 55 mm. If the pitch of the memory locations, in both the row and the column directions, is chosen to be approximately 50 μm then a data storage capacity of 5.4 Mb is obtained. This compares with only 1.8 Mb of storage capacity for a similarly sized memory element having a similar pitch of memory locations and in which the memory locations are simply either opaque or transmissive to represent two different data values.

It will be appreciated that in FIGS. 2, 4, 5, 6, 8 and 9 the numbers of memory locations actually depicted have deliberately been kept small for simplicity.

It should also be appreciated that in the foregoing description reference to columns and rows can be interchanged, the particular terms used in this description merely indicating directions depicted in the drawings.

Various modifications are possible to the above-described embodiments of systems according to the present invention, as described, for example, in EP-A-0509597.

Alternative forms of photodiodes can be used in the light detector component. Light sensitive devices other than photodiodes, for example photoresistors, photoconductors or photovoltaic devices fabricated as thin film structures on a supporting substrate and which are capable of providing an indicative electrical output in response to a predetermined light input can also be used.

While light sensing arrays comprising thin film photosensitive elements have been described, the photosensitive elements could instead be other than of the thin film type. For example the photosensitive element arrays would be formed by semiconductor devices within a bulk semiconductor body or by CCD sensors.

Although in all the above-described embodiments the read-out operation is described as involving illuminating the memory element with red, green and blue light separately, it will be appreciated that just two colours, or more than three colours could be used, and the number of possible colours characteristic for the memory locations changed accordingly. For example, only two illuminating colours, e.g. red and green, may be used, enabling then four possible colours of memory locations (including "white" and "black") to be used with unique two bit data values being obtained for each colour characteristic.

From reading the present disclosure, other modifications will be apparent to persons skilled in the art. Such modifications may involve other features which are already known in the fields of electro-optic shutters, thin film light sensitive devices, image sensors and optical memory elements and which may be used instead of or in addition to features already described herein.

I claim

1. An opto-electronic memory system comprising a memory element in which data is stored in rows of optically readable memory locations, electro-optical reading means for reading the rows of memory locations and comprising an array of light photosensitive elements, characterised in that data is stored at memory locations of the memory element as a colour with different data being represented by respective different colours and in that the reading means includes means for addressing the memory locations sequentially with reading light of different colours.

2. An opto-electronic memory system according to claim 1, characterised in that photosensitive elements are responsive to reading light reflected by the memory locations of the memory element.

3. An opto-electronic memory system according to claim 2, characterised in that the memory element includes memory locations which respectively are substantially reflective and substantially non-reflective to all the colours of reading light.

4. An opto-electronic memory system according to claim 1, characterised in that the photosensitive elements are responsive to reading light transmitted through the memory element at the memory locations.

5. An opto-electronic memory system according to claim 4, characterised in that the memory element includes memory locations which respectively are substantially transmissive and substantially non-transmissive to all colours of reading light.

6. An opto-electronic memory system according to claim 1, characterised in that each different colour used for the memory locations represents a respective multi-bit data value.

7. An opto-electronic memory system according to claim 1, characterised in that the colours used for the memory locations comprise the three primary colours and the three complementary colours and that the light addressing means is operable to address the memory locations with light of the three primary colours in sequence.

8. An opto-electronic memory system according claim 1, characterised in that the reading means comprises a linear array of photosensitive elements for reading a row of memory locations of the memory element at a time.

9. An opto-electronic memory system according to claim 1, characterised in that the reading means comprises a plurality of mutually-spaced linear arrays of photosensitive elements each of which is associated with a respective one o the different colours of reading light.

10. An opto-electronic memory system according to claim 1, characterised in that reading means comprises a two dimensional array of photosensitive elements comprising a set of linear photosensitive elements arranged in parallel with one another.

11. An opto-electronic memory system according to claim 10, characterised in that the light addressing means comprises a light source and an electro-optic shutter arrangement having an array of light shutter elements including colour filter elements, the shutter elements being selectively operable to provide different colour light outputs.

12. An opto-electronic memory system according to claim 11, characterised in that the electro-optic shutter arrangement comprises a colour liquid crystal display panel.

13. An opto-electronic memory system according to claim 11, characterized in that the electro-optic shutter arrangement comprises a color liquid crystal display panel.

14. An opto-electronic memory system according to claim 1, characterised in that the reading means comprises a two dimensional array of individual photosensitive elements in which each individual photosensitive element is arranged to read a respective memory location of the memory element.

15. An opto-electronic memory system according to claim 14, characterized in that the light addressing means comprises a light source and an electro-optic shutter arrangement having an array of light shutter elements including color filter elements, the shutter elements being selectively operable to provide different color light outputs.

* * * * *